(12) United States Patent
Drzaic et al.

(10) Patent No.: US 9,312,517 B2
(45) Date of Patent: *Apr. 12, 2016

(54) ELECTRONIC DEVICE DISPLAYS WITH BORDER MASKING LAYERS

(71) Applicant: Apple Inc., Cupertino, CA (US)

(72) Inventors: Paul S. Drzaic, Morgan Hill, CA (US); Adam T. Garelli, Santa Clara, CA (US); Victor H. Yin, Cupertino, CA (US); Dinesh C. Mathew, Fremont, CA (US)

(73) Assignee: Apple Inc., Cupertino, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 14/177,681

(22) Filed: Feb. 11, 2014

(65) Prior Publication Data

US 2014/0265822 A1    Sep. 18, 2014

Related U.S. Application Data

(60) Provisional application No. 61/798,451, filed on Mar. 15, 2013.

(51) Int. Cl.
*H01L 51/52* (2006.01)
*H01L 27/32* (2006.01)

(52) U.S. Cl.
CPC ........ *H01L 51/5284* (2013.01); *H01L 51/5281* (2013.01); *H01L 27/3244* (2013.01)

(58) Field of Classification Search
CPC .......................... H01L 51/5284; H01L 51/5281
See application file for complete search history.

(56) References Cited

U.S. PATENT DOCUMENTS

| 6,927,818 | B2 | 8/2005 | Hinata et al. |
| 8,264,645 | B2 | 9/2012 | Jepsen |
| 8,390,759 | B2 | 3/2013 | Doyle et al. |
| 8,755,010 | B2* | 6/2014 | Yang ................ G02F 1/133502 349/106 |
| 2011/0285640 | A1* | 11/2011 | Park .................... G02F 1/13338 345/173 |
| 2012/0087065 | A1* | 4/2012 | Kim ...................... G06F 1/1656 361/679.01 |
| 2012/0194896 | A1 | 8/2012 | Kothari et al. |
| 2013/0222351 | A1 | 8/2013 | Kao et al. |
| 2014/0049522 | A1* | 2/2014 | Mathew ............. H05B 33/0896 345/204 |

* cited by examiner

*Primary Examiner* — Mary Ellen Bowman
(74) *Attorney, Agent, or Firm* — Treyz Law Group, P.C.; G. Victor Treyz; Joseph F. Guihan

(57) ABSTRACT

An electronic device may be provided with a display. The display may have an active area with an array of display pixels and an inactive border region containing metal lines and other support circuitry. The array of display pixels may be formed from organic light-emitting diode structures in an organic-light-emitting diode layer. The display may also include an encapsulant layer on the organic light-emitting diode layer and a substrate layer. An opaque masking layer may be formed in the inactive border region. The opaque masking layer may overlap structures in the inactive border region such as the support circuitry, thereby blocking the support circuitry from view. The opaque masking layer may be formed a glass layer in the display, in part of a polarizer in a display, under a planarization layer, or between other layers in the display.

20 Claims, 14 Drawing Sheets

ELECTRONIC DEVICE DISPLAYS WITH BORDER MASKING LAYERS

This application claims priority to U.S. provisional patent application No. 61/798,451 filed Mar. 15, 2013, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

It can be challenging to form displays for electronic devices. Displays such as organic light-emitting diode displays typically include a rectangular array of active display pixels surrounded by an inactive border region filled with metal signal lines and other support circuitry. If care is not taken, undesirable reflections from the support circuitry in the inactive border region will be visible to a user of an electronic device.

It would therefore be desirable to be able to provide improved displays for electronic devices.

SUMMARY

An electronic device may be provided with a display. The display may have an active area with an array of display pixels and an inactive border region containing metal lines and other support circuitry.

The array of display pixels may be formed from organic light-emitting diode structures in an organic-light-emitting diode layer. The display may also include an encapsulant layer on the organic light-emitting diode layer and a substrate layer.

An opaque masking layer may be formed in the inactive border region. The opaque masking layer may overlap structures in the inactive border region such as the support circuitry, thereby blocking the support circuitry from view.

The opaque masking layer may be formed a glass layer in the display, on or within the layers of a polarizer in a display, under a planarization layer, or between other layers in the display.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
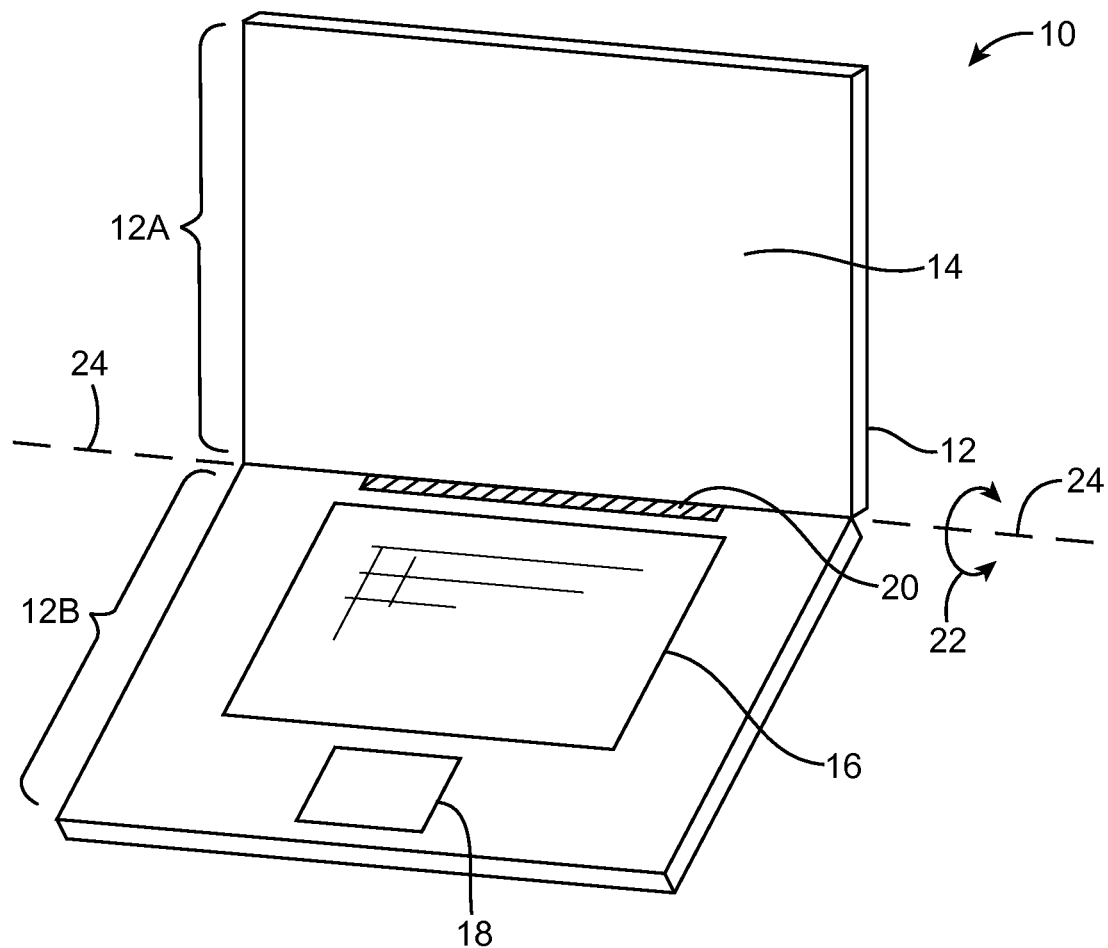
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
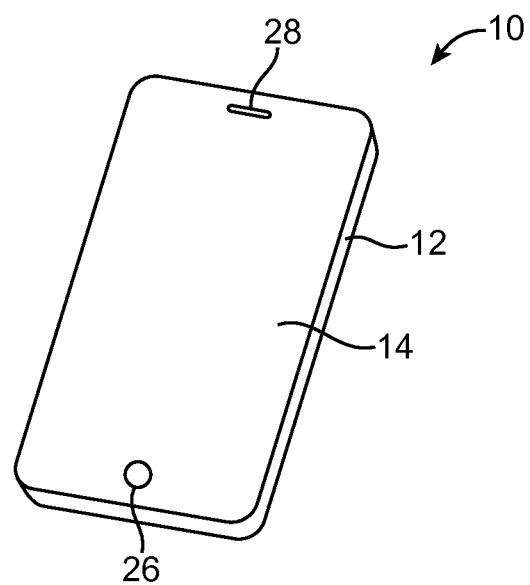
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
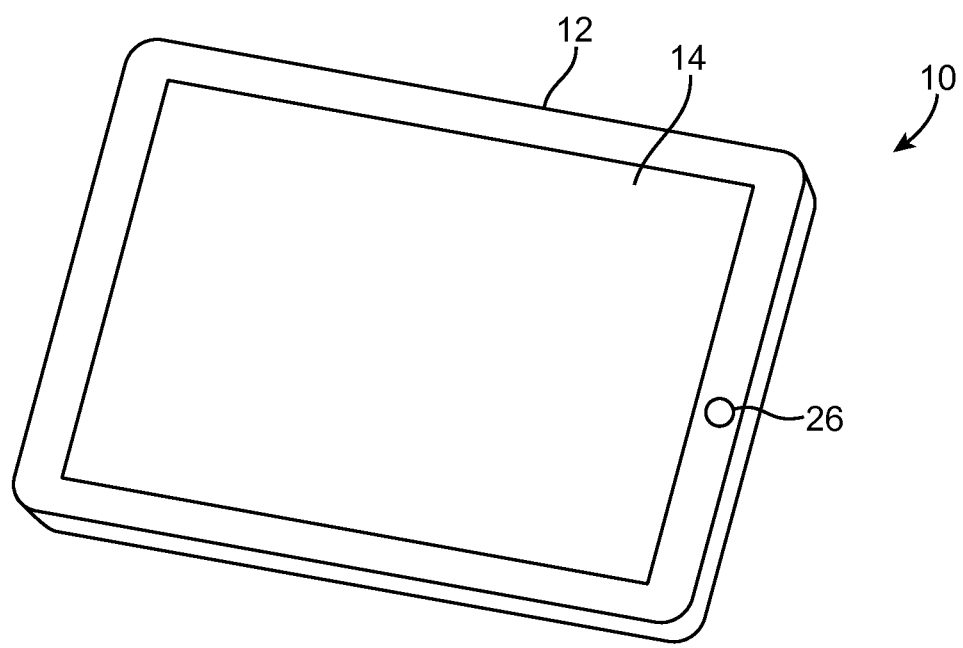
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
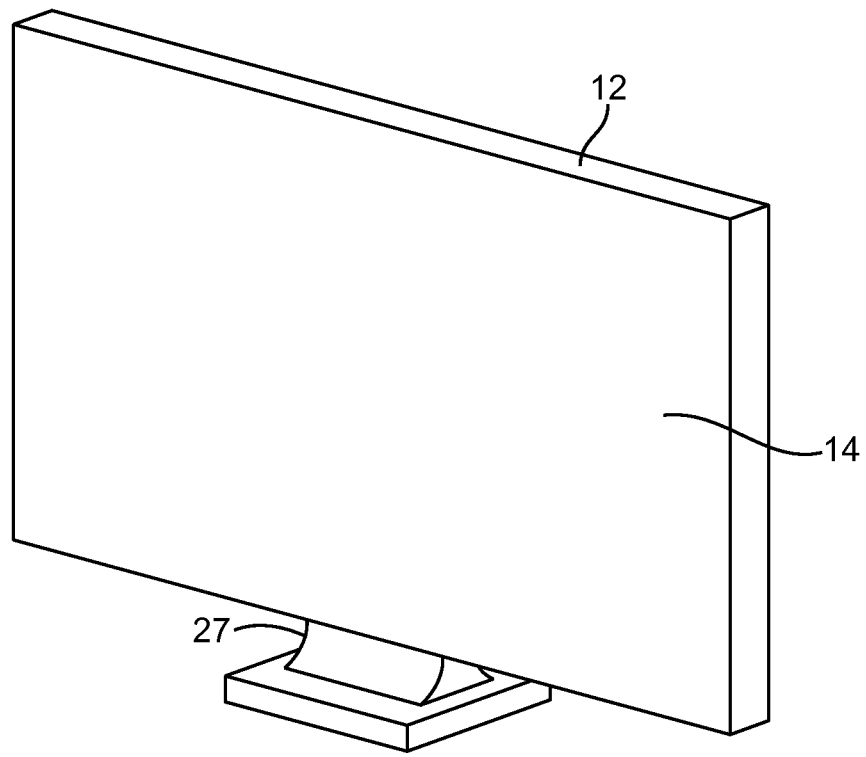
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode components or other suitable display pixel structures.

A display cover layer may cover the surface of display 14 or a display layer such as a color filter layer, polarizer layer, polymer film, or other portion of a display may be used as the outermost (or nearly outermost) layer in display 14. The outermost display layer may be formed from a transparent glass sheet, a clear plastic layer, or other transparent member.

Figure 5:
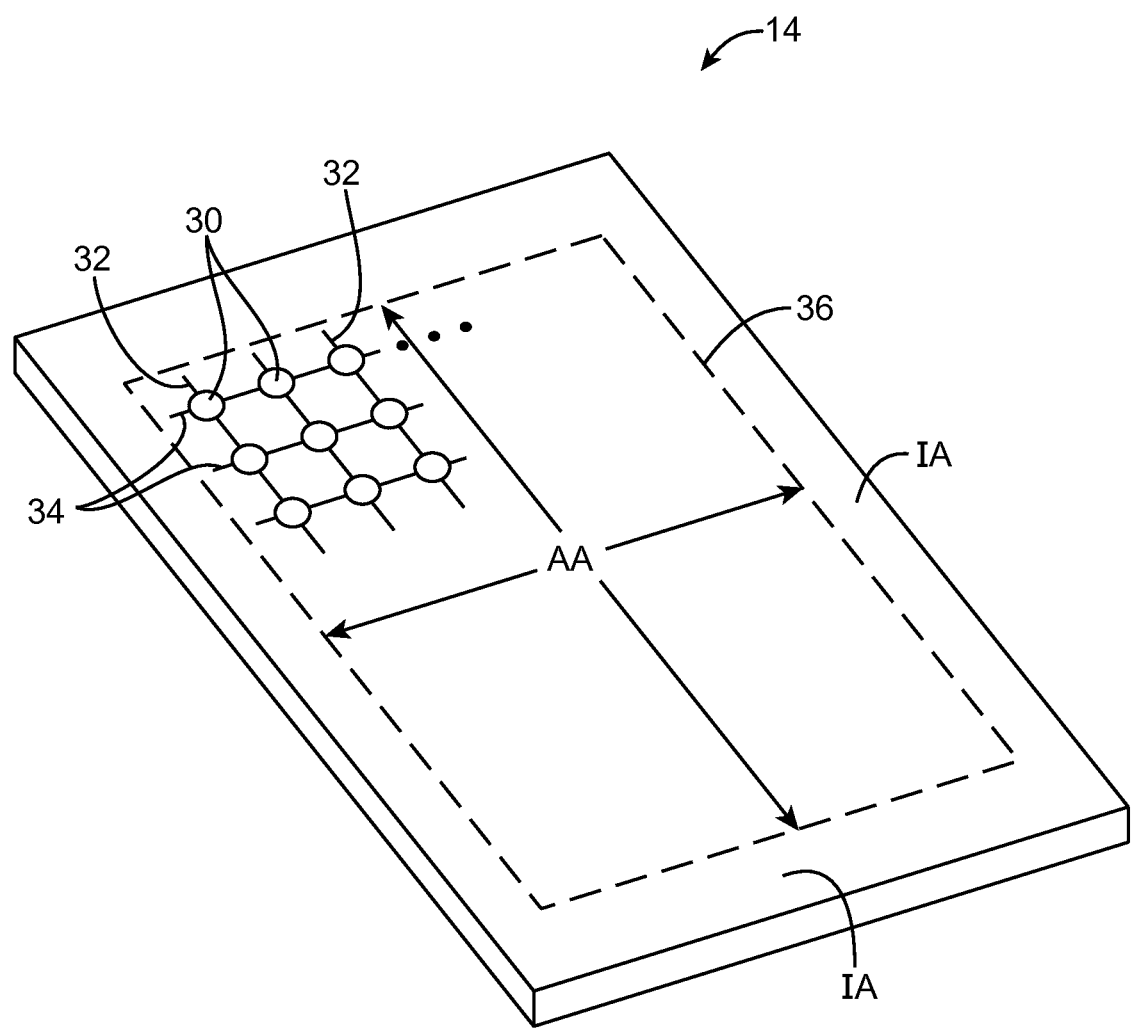
FIG. 5 is a perspective view of an illustrative display in accordance with an embodiment of the present invention.

A perspective view of an illustrative display is shown in FIG. 5. As shown in FIG. 5, display 14 may have an array of display pixels 30. Control signals may be supplied to display pixels 30 on vertical control lines 32 and horizontal control lines 34. By controlling display pixels 30, control circuitry in device 10 may display images for a user of device 10 on display 14.

Display pixels 30 may be arranged in a rectangular array in the center of display 14. During use of device 10, display pixels 30 form images, so display pixels 30 in display 14 are sometimes said to form an active area AA of display 14. Active area AA may be bounded by dashed line rectangle 36 in the example of FIG. 5. An inactive area IA may border some or all of the edges of active area AA. For example, a rectangular ring-shaped inactive area IA may form a border that surrounds active area AA, as shown in FIG. 5. Display 14 typically includes signal lines (e.g., metal traces) and other support circuitry for operating display 14 (i.e., circuitry for driving signals into display pixels 30) in inactive border region IA. The support circuitry in inactive area IA does not produce light for images on display 14.

To prevent structures in inactive area IA from being visible to a user of device 10, it may be desirable to cover areas IA with an opaque mask. The opaque mask may have the shape of a rectangular ring (i.e., the same shape as inactive area IA in FIG. 5) or may have other suitable shapes. Opaque masking material such as organic materials and/or inorganic materials may be used in forming an opaque masking layer in area IA. Examples of opaque masking material that may be used in forming an opaque masking layer include black chrome (chrome oxide), other metal oxides, black ink, ink of other colors (e.g., white ink, red ink, etc.), polymers, metals, oxides, nanotubes such as carbon nanotubes, black silicon (e.g., black silicon processed using a laser), nitrides, and other opaque materials. Materials such as opaque ink may be deposited using pad printing, screen printing, ink-jet printing, and other deposition techniques. Materials such as metal oxides and other inorganic materials may be deposited using vacuum coating (e.g., physical vapor deposition using an evaporator or sputtering tool). Shadow masking and/or photolithography may be used in patterning deposited masking material. If desired, opaque masking material may also be deposited using lamination techniques.

Figure 6:
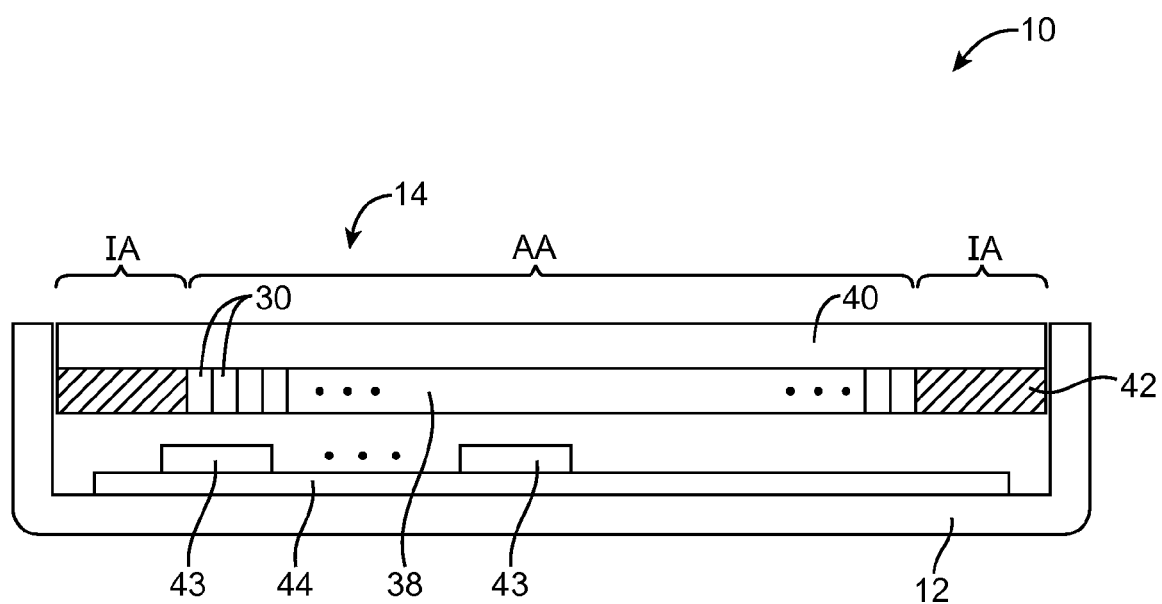
FIG. 6 is a cross-sectional side view of an electronic device with a display in accordance with an embodiment of the present invention.

FIG. 6 is a cross-sectional side view of an illustrative electronic device with a display. As shown in FIG. 6, device 10 may include housing 12. Display 14 may be mounted in housing 12. Display 14 may include an array of display pixels 30 in display structures 38. Display structures 38 may be based on organic light-emitting diode display structures including layers such as a substrate layer, an encapsulation layer, and an organic light-emitting diode layer containing organic light-emitting diode display pixels 30. In the example of FIG. 6, organic light-emitting diode display layers 38 are attached to the lower surface of an external display layer such as display cover layer 40. Display cover layer 40 may be formed from a layer of transparent glass, a clear plastic layer, or other transparent member (e.g., one or more clear sheets of material). Display cover layer 40 may help to protect underlying display structures such as organic light-emitting diode display structures 38. In inactive area IA, display structures 38 (e.g., the organic light-emitting diode layer of structures 38) may contain metal lines and other support circuitry 42. An opaque masking layer may be formed in inactive area IA to block the support circuitry from view. Display pixels 30 may form a rectangular array in active area AA.

Device 10 may have internal components 43 mounted on substrate 44. Components 43 may include integrated circuits such as microprocessors, application-specific integrated circuits, microcontrollers, and other processing circuitry. Components 43 may also include storage circuitry such as memory circuits and other memory devices. Input-output circuitry such as sensors, buttons, and other input-output circuitry may also be included in components 43. Substrates such as substrate 44 may be used to interconnect the circuitry of components 43. Substrate 44 may be a rigid printed circuit board (e.g., a fiberglass-filled epoxy board) or a flexible printed circuit (e.g., a printed circuit formed from a flexible substrate such as polyimide or other polymer layer).

Display 14 may be based on organic light-emitting diode display pixels or display pixels formed using other display technologies. Configurations for display 14 in which display pixels 30 are formed from organic light-emitting diodes and in which display 14 is an organic light-emitting diode display may sometimes be described herein as an example. This is, however, merely illustrative. Device 10 may, in general, include any suitable type of display.

Figure 7:
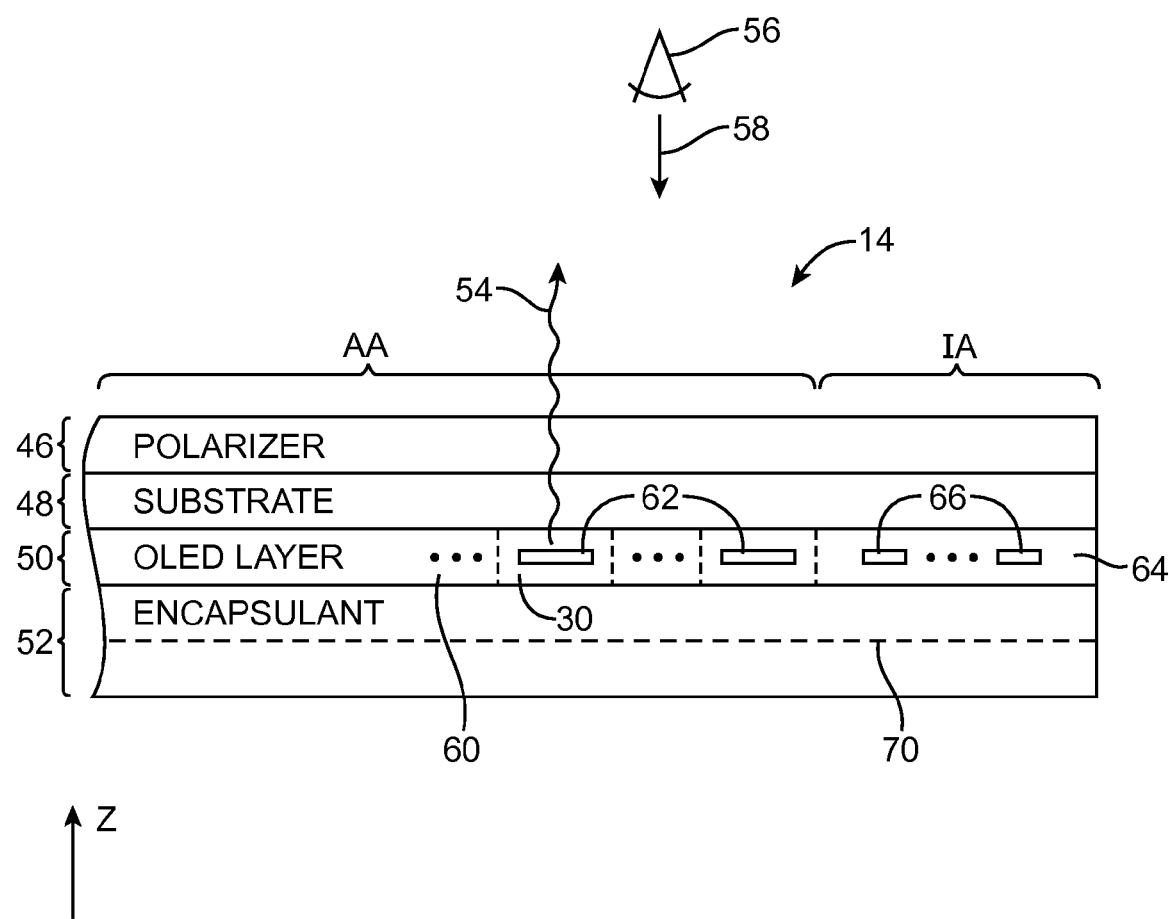
FIG. 7 is a cross-sectional side view of an illustrative bottom emission organic light-emitting diode display in accordance with an embodiment of the present invention.

A cross-sectional side view of display 14 in a configuration using a bottom emission organic light-emitting diode display configuration is shown in FIG. 7. As shown in FIG. 7, bottom emission organic light-emitting diode display 14 may have a substrate layer such as substrate 48. Substrate 48 may include one or more transparent layers such as one or more glass layers, one or more plastic layers, or other transparent substrate layers. As an example, substrate 48 may be formed from a layer of clear glass.

Organic light-emitting diode layer 50 may be formed on substrate 48 (i.e., on the surface of substrate 48 that is the lower or innermost of the two opposing surfaces of substrate 48 in the orientation of FIG. 7). During operation, light from display pixels 30 in organic light-emitting diode layer 50 may pass through substrate 48 (i.e., through substrate layer 48 on which the organic light-emitting diodes, thin-film-transistors, and other organic light-emitting diode circuitry have been formed) in direction Z, as illustrated by light ray 54.

In active area AA, organic light-emitting diode layer 50 includes organic light-emitting diode structures 60 (e.g., anode electrode structures, cathode electrode structures, emissive layers, signal lines, thin-film transistors, etc.). For example, active area organic light-emitting diode structures 60 in organic light-emitting diode layer 50 may include metal structures 62 (e.g., anode and cathode structures and metal traces for signal lines). The light produced by the organic light-emitting diode structures in active area AA of organic light-emitting diode layer 50 such as light ray 54 produces an image for a viewer such as viewer 56 who is viewing display 14 in direction 58.

In inactive area IA, organic light-emitting diode layer 50 includes inactive area organic light-emitting diode display structures such as inactive area structures 64. Inactive area structures 64 may include support circuitry such as metal traces for signal lines, thin-film circuitry such as driver circuitry, and other circuitry that does not produce light 54 for viewer 56. For example, inactive area structures 64 of organic light-emitting diode layer 50 may include metal structures such as metal traces for signal lines 66.

To suppress ambient light reflections from metal structures 62 (e.g., from reflective cathode structures in bottom emission display 14), display 14 may be provided with a reflection suppressing layer such as circular polarizer layer 46. Circular polarizer 46 may, if desired, overlap with inactive area IA, as shown in FIG. 7.

Encapsulant layer 52 may be formed on organic light-emitting diode layer 50 (i.e., on the lower surface of layer 50 in the orientation of FIG. 7). Encapsulant layer 52 may be used to encapsulate the organic light-emitting diode structures of organic light-emitting diode layer 50. Encapsulant layer 52 may be formed from a glass or plastic layer, may be formed from a glass or plastic layer coated with a thin film such as an inorganic coating, may be formed from a layer of metal (e.g., a metal plate, metal can, or metal foil), or may be formed from a metal coating on a substrate layer such as a glass layer or plastic layer (as examples). If desired, a coating of water-absorbing and/or oxygen absorbing material may be formed on a glass layer or other encapsulant layer to help sequester oxygen and water. As illustrated by dashed line 70, encapsulant layer 52 may contain two or more sublayers (e.g., a glass plate and a coating, a metal layer on a glass or polymer substrate or other dielectric layer, etc.).

Figure 8:
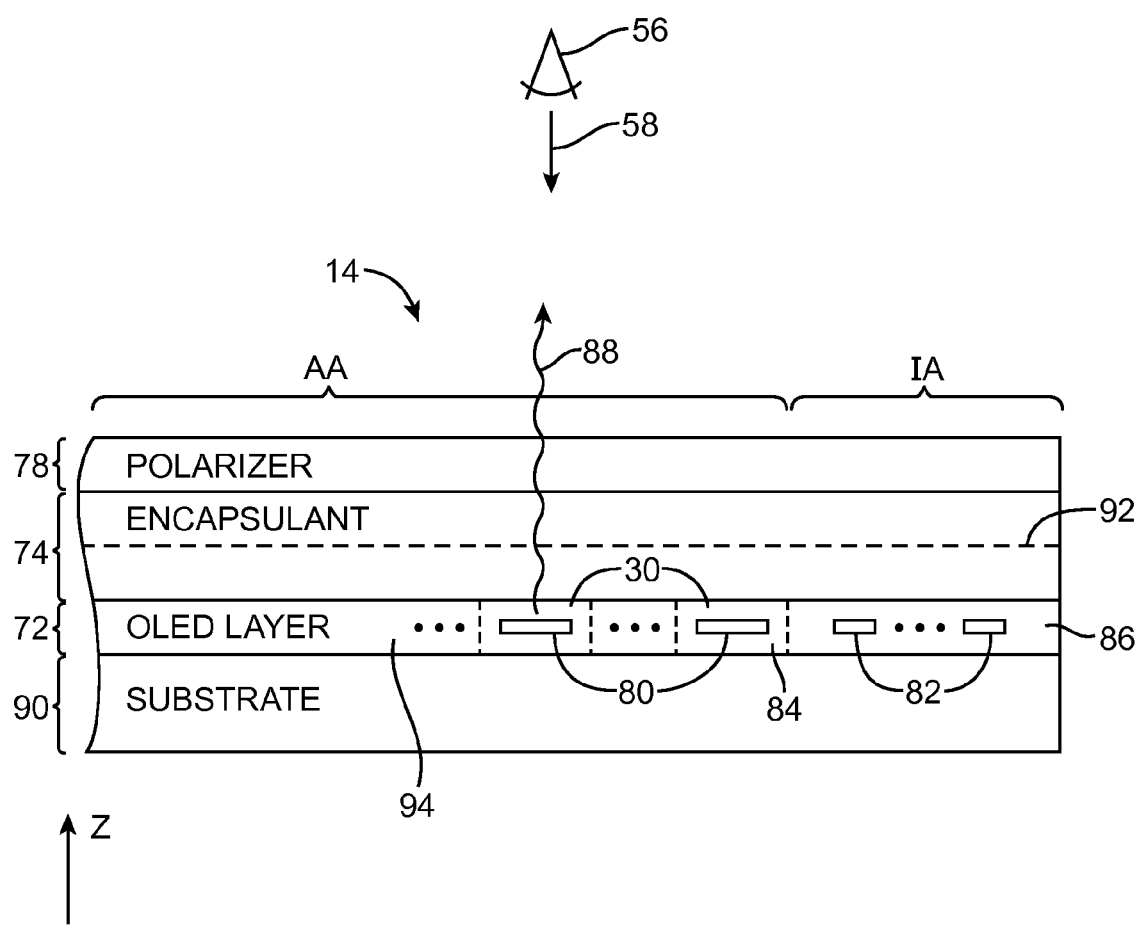
FIG. 8 is a cross-sectional side view of an illustrative top emission organic light-emitting diode display with a reflection suppression layer formed from a circular polarizer in accordance with an embodiment of the present invention.

A cross-sectional side view of display 14 in a configuration using a top emission organic light-emitting diode display configuration is shown in FIG. 8. As shown in FIG. 8, top emission organic light-emitting diode display 14 may have a substrate layer such as substrate 90. Substrate 90 may include one or more transparent layers such as one or more glass layers, one or more plastic layers, or other transparent substrate layers. As an example, substrate 90 may be formed from a layer of glass.

Organic light-emitting diode layer 72 may be formed on substrate 90 (i.e., on the upper surface of substrate 90 in the orientation of FIG. 8). During operation, light from display pixels 30 in organic light-emitting diode layer 72 may pass upwards in Z, as illustrated by light ray 88.

In active area AA, organic light-emitting diode layer 72 includes organic light-emitting diode structures 94 (e.g., anode electrode structures, cathode electrode structures, emissive layers, signal lines, thin-film transistors, etc.). For example, active area organic light-emitting diode structures 94 in organic light-emitting diode structures layer 72 may include reflective structures 80 (e.g., anode and cathode structures and metal traces for signal lines such as a reflective anode formed from a metal such as aluminum or a metal such as aluminum that has been covered with a coating such as indium tin oxide). The light produced by the organic light-emitting diode structures in active area AA of organic light-emitting diode layer 72 such as light ray 88 produces an image for a viewer such as viewer 56 who is viewing display 14 in direction 58.

In inactive area IA, organic light-emitting diode layer 72 includes inactive area organic light-emitting diode display structures such as inactive area structures 86.

Inactive area structures 86 may include supporting circuitry such as metal traces for signal lines, and other circuitry that does not produce light 88 for viewer 56 but that supports the operation of the display pixels in active area AA. For example, inactive area structures 86 of organic light-emitting diode layer 72 may include metal structures such as metal traces for signal lines 82.

To suppress ambient light reflections from metal structures 80 (e.g., from reflective anode structures in top emission display 14), display 14 may be provided with a reflection suppressing layer (reflection suppression layer) such as circular polarizer layer 78. Circular polarizer 78 may, if desired, overlap inactive area IA and may cover support circuitry 86, as shown in FIG. 8.

Encapsulant layer 74 may be formed on layer 72 under polarizer 78 and may be used to encapsulate the organic light-emitting diode structures of organic light-emitting diode layer 72. Encapsulant layer 74 may be formed from a transparent material such as a clear glass layer, a clear layer of polymer, a clear inorganic thin-film, or other clear materials. As an example, layer 74 may be formed from a sheet of transparent glass. As illustrated by dashed line 92, encapsulant layer 74 may contain two or more sublayers. For example, encapsulant layer 74 may be formed from a glass plate that is covered with an inorganic thin film coating.

Figure 9:
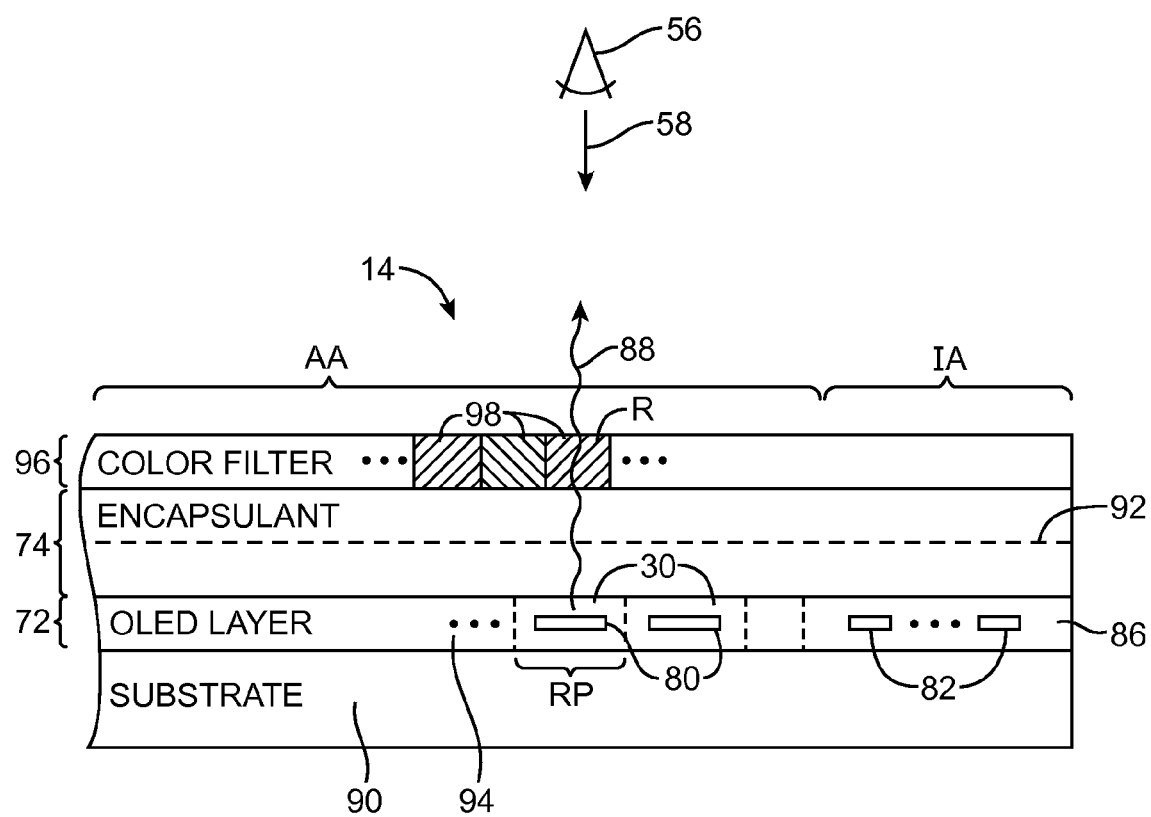
FIG. 9 is a cross-sectional side view of an illustrative top emission organic light-emitting diode display with a reflection suppression layer formed from a color filter layer in accordance with an embodiment of the present invention.

In illustrative top emission display 14 of FIG. 9, color filter layer 96 is used as a reflection suppressing layer. Color filter layer 96 may contain an array of color filter elements 98.

Color filter elements 98 may, for example, be formed from a polymer such as photoresist that has been colored with dye or pigment. With one suitable arrangement, color filter elements 98 include red, blue, and green color filter elements. Organic light-emitting diode layer 72 contains display pixels configured to emit different wavelengths of light (e.g., red, blue, green).

The display pixels in organic light-emitting diode structures 94 are aligned with color filter elements 98 of matching colors. For example, red display pixels 30 may be aligned with red color filter elements 98, blue display pixels 30 may be aligned with blue color filter elements 98, and green display pixels 30 may be aligned with green color filter elements 98. In the example of FIG. 9, red display pixel RP is aligned with red color filter element R. Incoming ambient light from outside of display 14, will reach reflective structures such as reflective structures 80 only after passing through a color filter element. Each color filter element may be configured to exhibit a narrow passband that is aligned with a relatively narrow spectral width for emitted light from a respective display pixel. The narrow passband of color filter elements 98 ensures that most incident ambient white light will be absorbed in color filter layer 96, rather than passing through layer 74 into structures 72 and reflecting off of reflective structures 80. Outward transmission of light 88 from display pixels 30 is not hindered by the presence of color filter elements 98, because the pass bands of color filter elements 98 are sufficiently wide to allow the colored light emitted from the matched display pixels to pass without being significantly attenuated.

As with circular polarizer 78 of top emission display 14 of FIG. 8, color filter layer 96 of top emission display 14 of FIG. 9 may extend over inactive area IA and may cover support circuitry 86.

To facilitate light reflection suppression in inactive areas IA of displays such as the displays of FIGS. 7, 8, and 9, it may be desirable to incorporate one or more layers of patterned opaque masking material (e.g., black material, white material, or other material that is opaque to light) into one or more of the layers of display 14 in inactive area IA.

Figure 10:
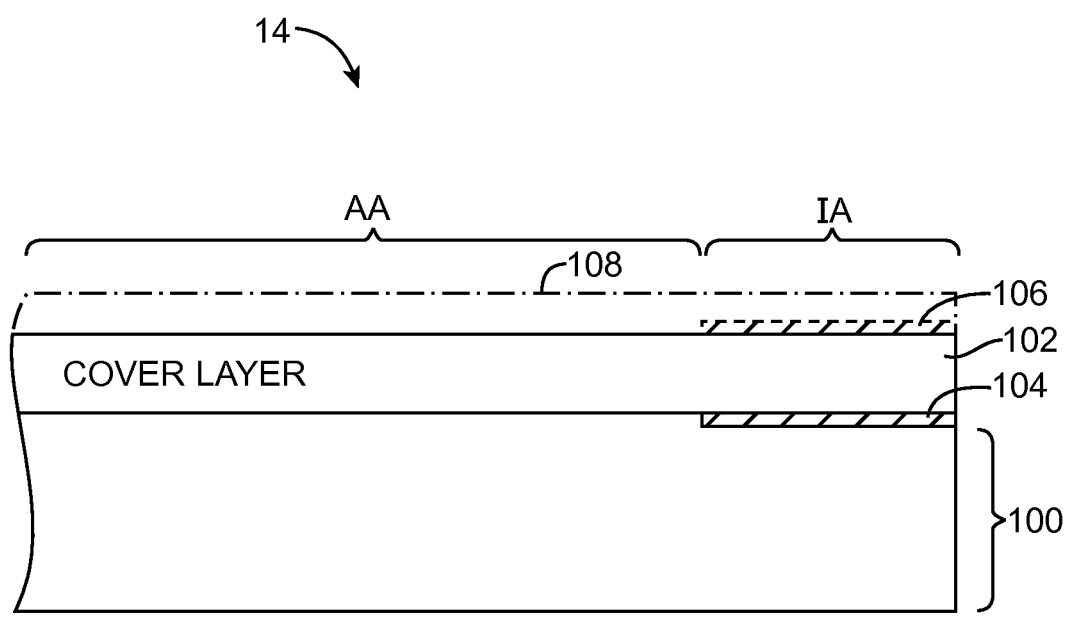
FIG. 10 is a cross-sectional side view of an illustrative display having an opaque masking layer located above or below a display cover layer in accordance with an embodiment of the present invention.

As shown in FIG. 10, display layers 100 (e.g., display layers such as the layers of FIG. 7, FIG. 8, or FIG. 9) may be covered with an optional display cover layer such as display cover layer 102. Display cover layer 102 may be formed from a layer of plastic, a clear planar glass layer, or a transparent sheet of other materials. To hide structures in inactive area IA from view by a user of device 10, display 14 of FIG. 10 may be provided with an opaque masking layer such as layer 104. Opaque masking layer 104 may be patterned to form a rectangular ring surrounding the active area AA of display 14 or other suitable mask shapes overlapping inactive area IA. Opaque masking layer 104 may be formed on the top of layers 100 (e.g., on top polarizer 46, on top of polarizer 78, or on top of color filter layer 96) or may be formed on the underside of display cover layer 102.

If desired, an opaque masking layer in inactive area IA may be formed on top of display cover layer 102. For example, an opaque masking layer such as opaque masking layer 106 may be formed in inactive area IA on the upper (outermost) surface of display cover layer 102 and may be covered with an optional coating 108 (e.g., a polymer layer, an inorganic layer, etc.).

Figure 11:
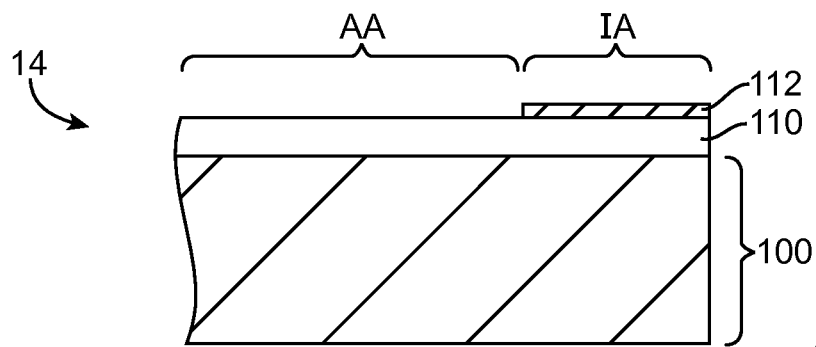
FIG. 11 is a cross-sectional side view of an illustrative display with an opaque masking layer located above a film layer that is formed on the top of the display in accordance with an embodiment of the present invention.
Figure 12:
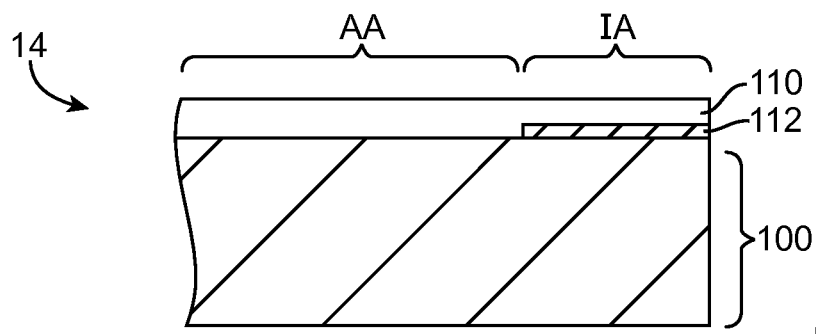
FIG. 12 is a cross-sectional side view of an illustrative display with an opaque masking layer located below a film layer that is formed on the top of the display in accordance with an embodiment of the present invention.

If desired, an additional layer of a polymer film or other film may be formed on the surface of display structures 100. This layer of film may be used in forming an opaque masking layer in inactive area IA. In the example of FIG. 11, additional film 110 has been added to display structures 100 (e.g., the display structures of display 14 of FIG. 7, FIG. 8, or FIG. 9) and opaque masking layer 112 has been formed on the surface of additional film 110 in inactive area IA. In the example of FIG. 12, opaque masking layer 112 has been formed between additional film 110 and display structures 100. Additional film 110 may be based on one or more layers of material such as a transparent polymer layer and may have materials, coatings, surface treatments, or other attributes to provide display 14 with desired features such as smudge resistance, scratch resistance, anti-reflection behavior, antistatic behavior, and other desired features. Opaque masking layer 112 may have the shape of a rectangular ring (as an example).

Figure 13:
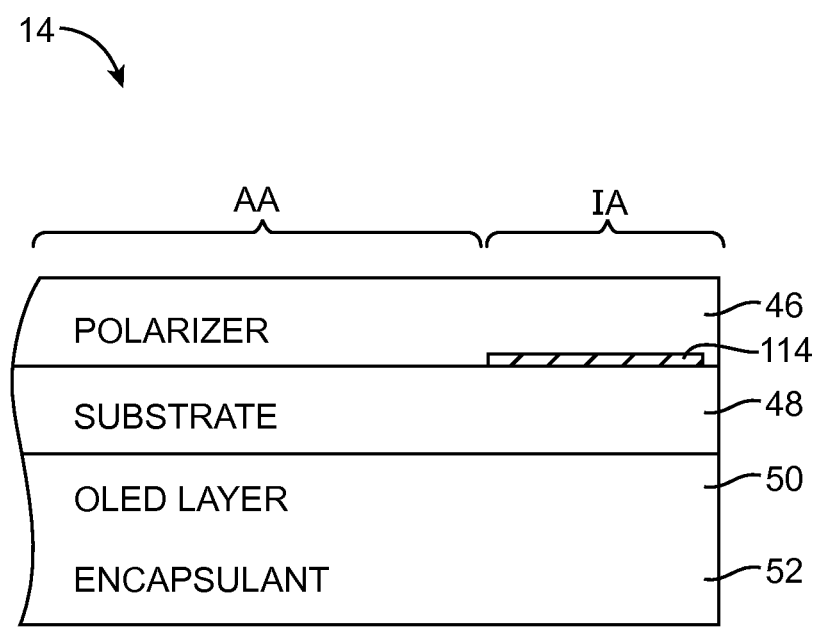
FIG. 13 is a cross-sectional side view of an illustrative bottom emission organic light-emitting diode display with an opaque masking layer located between a polarizer layer and a substrate layer in accordance with an embodiment of the present invention.

FIG. 13 is a cross-sectional side view of display 14 illustrating how an opaque masking layer such as opaque masking layer 114 may be formed between polarizer 46 and substrate 48 in a bottom emission display of the type shown in FIG. 7. Opaque masking layer 114 may be deposited and patterned on the upper surface of substrate 48 of display 14 of FIG. 13 or may be deposited and patterned on the lower surface of polarizer 46 of display 14 of FIG. 13.

Figure 14:
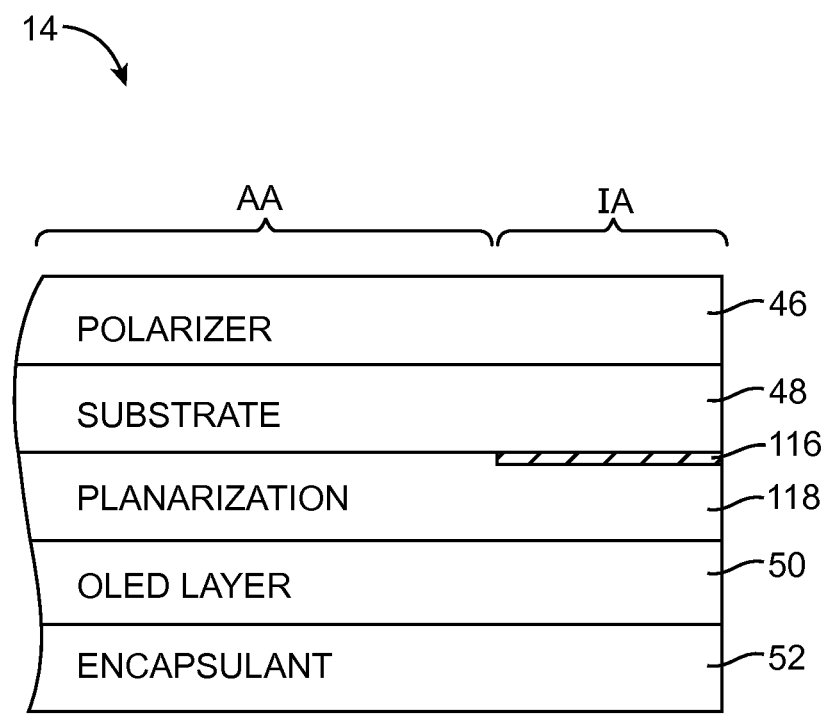
FIG. 14 is a cross-sectional side view of an illustrative bottom emission organic light-emitting diode display with a black masking layer formed on a substrate layer and covered with a planarization layer in accordance with an embodiment of the present invention.

FIG. 14 is a cross-sectional side view of a bottom emission display such as bottom emission display 14 of FIG. 7 in a configuration in which opaque masking layer 116 has been formed on the surface of substrate 48 facing organic light-emitting diode layer 50. If desired, a planarization layer such as planarization layer 118 may be formed over opaque masking layer 116 in inactive area IA and over the rest of substrate 48 in active area AA. The organic light-emitting diode structures of organic light-emitting diode layer 50 may then be formed on planarization layer 118 (i.e., on the lower surface of planarization layer 118 in the orientation of FIG. 14). Examples of planarization materials that may be used in forming planarization layer 118 include one or more layers of cyclobutane, one or more layers of spin-on glass, or one or more layers of polymers. Other types of planarization layers may be used in forming planarization layer 118, if desired.

Figure 15:
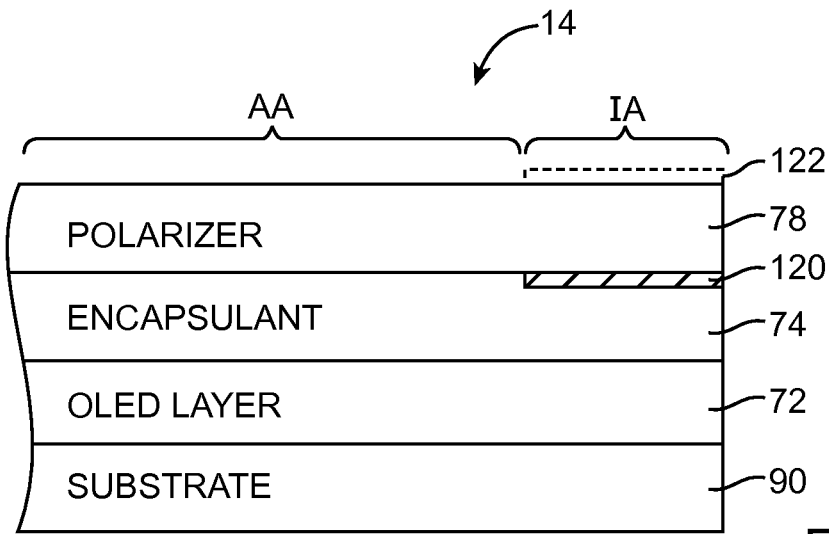
FIG. 15 is a cross-sectional side view of an illustrative top emission organic light-emitting diode display with a masking layer formed above or below a polarizer layer in accordance with an embodiment of the present invention.

FIG. 15 is a cross-sectional side view of a top emission display of the type shown in FIG. 8. In the illustrative configuration of FIG. 15, opaque masking layer 120 has been formed between circular polarizer 78 and encapsulant layer 74 in inactive area IA. Opaque masking layer 120 may be formed on the top of encapsulant 74 (e.g., on top of a glass layer or other transparent member in layer 74) or may be formed on the bottom of circular polarizer 78. If desired, the opaque masking layer may be formed on the top surface of circular polarizer 78, as illustrated by dashed line 122.

Figure 16:
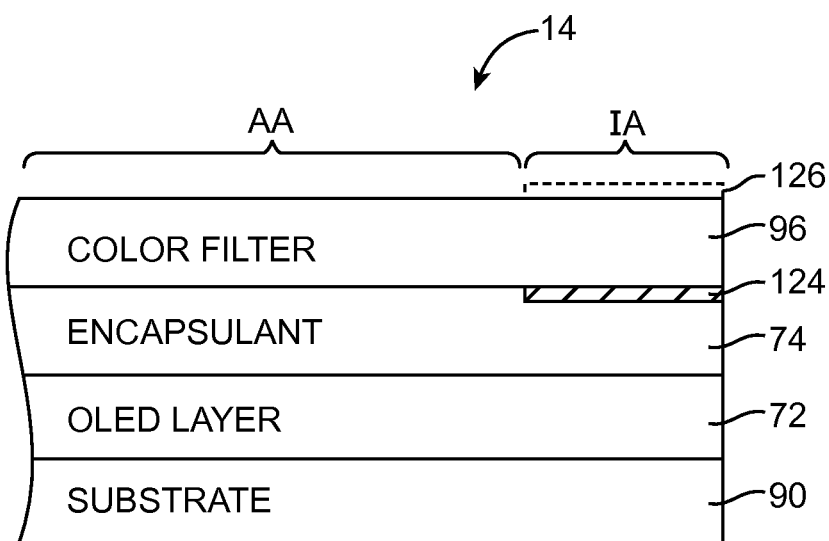
FIG. 16 is a cross-sectional side view of an illustrative top emission organic light-emitting diode display with a masking layer formed above or below a color filter layer in accordance with an embodiment of the present invention.

FIG. 16 is a cross-sectional side view of a top emission display of the type shown in FIG. 9. In the illustrative configuration of FIG. 16, opaque masking layer 124 has been formed between color filter layer 96 and encapsulant layer 74 in inactive area IA. Opaque masking layer 124 may be formed on the top of encapsulant 74 (e.g., on top of a glass layer or other transparent member in layer 74) or may be formed on the bottom of color filter layer 96. If desired, the opaque masking layer may be formed on the top surface of color filter layer 96, as illustrated by dashed line 126.

Figure 17:
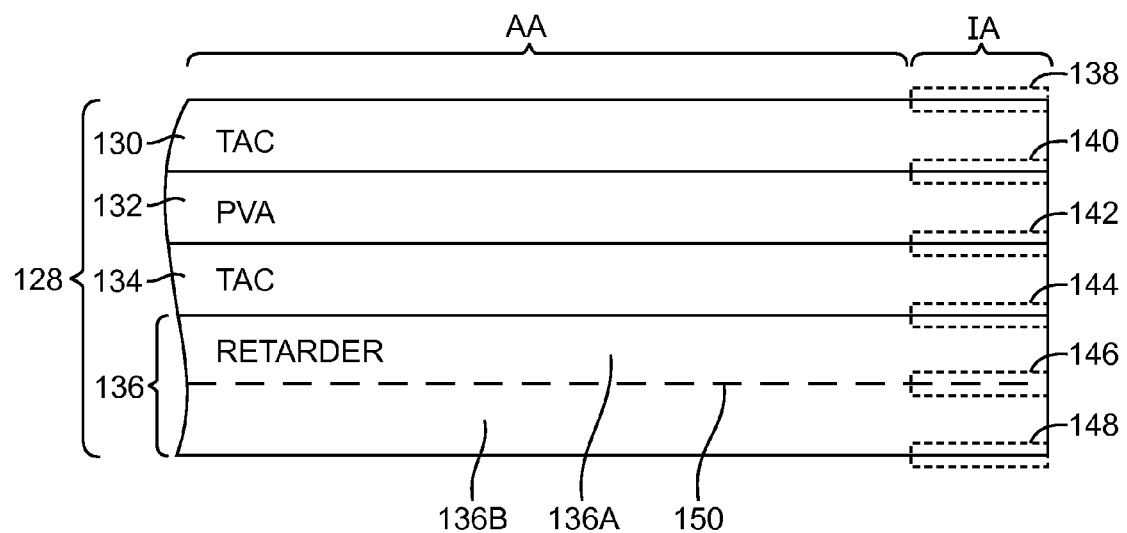
FIG. 17 is a cross-sectional side view of an illustrative polarizer showing locations in which an opaque masking layer for a display may be formed in accordance with an embodiment of the present invention.

FIG. 17 is a cross-sectional side view of an illustrative circular polarizer in display 14. As shown in FIG. 17, circular polarizer 128 (e.g., circular polarizer 46 of FIG. 7 or circular polarizer 78 of FIG. 8) may be formed from multiple layers of material (i.e., polarizer 128 may be formed form multiple polarizer sublayers). Polarizer film 132 may be formed from a stretched polymer such as stretched polyvinyl alcohol (PVA) and may therefore sometimes be referred to as a PVA layer. Iodine may be placed on the stretched PVA film so that iodine molecules align with the stretched film and form the polarizer. Other types of polarizer films may be used if desired.

Polarizer film 132 may be sandwiched between supporting layers 130 and 134. Polarizer support layers 130 and 134 may be formed from a material such as tri-acetyl cellulose (TAC) and may sometimes be referred to as TAC films. If desired, layers 130 and 134 may be formed from other polymers. The TAC films may help hold the PVA film in its stretched configuration and may protect the PVA film. Other films may be attached to polarizer film 132 if desired.

Polarizer 128 can be provided with a retarder layer such as retarder layer 136. Retarder 136 may be, for example, a quarter-wave plate. To minimize the effects of chromatic dispersion, quarter-wave plate 136 may, if desired, be formed from two eighth-wave plates with counteracting chromatic dispersion characteristics (e.g., eighth-wave plates 136B and 136A joined along seam 150).

As shown in FIG. 17, opaque masking material can be formed in inactive area IA in locations such as location 138 (e.g., on top of the upper surface of a polarizer support layer such as TAC layer 130), in the location of opaque masking layer 140 between TAC layer 130 and PVA layer 132 (e.g., on the lower surface of TAC layer 130 or the upper surface of PVA layer 132), in the location of opaque masking layer 142 between PVA layer 132 and TAC layer 134, (e.g., on the lower surface of PVA layer 132 or on the upper surface of TAC layer 134), in the location of opaque masking layer 144 between TAC layer 134 and retarder 136 (e.g., on the lower surface of TAC layer 134 or on the upper surface of retarder 136), in the location of opaque masking layer 146 (e.g., on the lower surface of eighth wave plate 136A or the upper surface of eighth wave plate 136B), or in the location of opaque masking layer 148 (e.g., on the lower surface of retarder 136 or on the upper surface of substrate 48 of FIG. 7 or the upper surface of encapsulant layer 74 of FIG. 8).

The foregoing is merely illustrative of the principles of this invention and various modifications can be made by those skilled in the art without departing from the scope and spirit of the invention.

What is claimed is:

1. A display with an active area and an inactive border, comprising:
   an organic light-emitting diode layer having an array of organic light-emitting diode display pixels in the active area and having support circuitry in the inactive area; and
   an opaque masking layer in the inactive area that covers the support circuitry.

2. The display defined in claim 1 further comprising a display cover layer, wherein the opaque masking layer is formed on an inner surface of the display cover layer.

3. The display defined in claim 1 further comprising:
   a display cover layer; and
   a film on the display cover layer, wherein the opaque masking layer is formed between the film and the display cover layer.

4. The display defined in claim 1 further comprising a circular polarizer, wherein the opaque masking layer is formed between the circular polarizer and the organic light-emitting diode layer.

5. The display defined in claim 4 further comprising:
   an encapsulant layer; and
   a substrate layer, wherein the organic light-emitting diode layer is located between the substrate layer and the encapsulant layer and wherein the opaque masking layer is formed between the circular polarizer and the substrate layer.

6. The display defined in claim 4 further comprising:
   an encapsulant layer; and
   a substrate layer, wherein the organic light-emitting diode layer is located between the substrate layer and the encapsulant layer and wherein the opaque masking layer is formed on the substrate layer between the substrate layer and the organic light-emitting diode layer and wherein the display further comprises a planarization layer that covers the opaque masking layer on the substrate layer.

7. The display defined in claim 1 further comprising:
   a circular polarizer; and
   an encapsulant layer between the circular polarizer and the organic light-emitting diode layer, wherein the opaque masking layer is formed between the circular polarizer and the encapsulant layer.

8. The display defined in claim 1 further comprising:
   a color filter layer; and
   an encapsulant layer between the color filter layer and the organic light-emitting diode layer, wherein the opaque masking layer is formed between the color filter layer and the encapsulant layer.

9. The display defined in claim 1 further comprising a polarizer having multiple polarizer sublayers and wherein the opaque masking layer is formed between the multiple polarizer sublayers.

10. The display defined in claim 9 wherein the polarizer comprises:
    a first polarizer support layer;
    a second polarizer support layer;
    a polarizer film between the first and second polarizer support layers; and
    a retarder, wherein the second polarizer support layer is located between the retarder and the polarizer film and wherein opaque masking layer is located between the first polarizer support layer and the polarizer film.

11. The display defined in claim 9 wherein the polarizer comprises:
    a first polarizer support layer;
    a second polarizer support layer;
    a polarizer film between the first and second polarizer support layers; and
    a retarder, wherein the second polarizer support layer is located between the retarder and the polarizer film and wherein opaque masking layer is located between the polarizer film and the second polarizer support layer.

12. The display defined in claim 9 wherein the polarizer comprises:
    a first polarizer support layer;
    a second polarizer support layer;
    a polarizer film between the first and second polarizer support layers; and
    a retarder, wherein the second polarizer support layer is located between the retarder and the polarizer film and wherein opaque masking layer is located between the second polarizer support layer and the retarder.

13. The display defined in claim 9 wherein the polarizer comprises:
    a first polarizer support layer;
    a second polarizer support layer;
    a polarizer film between the first and second polarizer support layers; and
    a retarder, wherein the second polarizer support layer is located between the retarder and the polarizer film, wherein the retarder includes a first eighth-wave plate and a second eighth-wave plate and wherein opaque masking layer is located between the first eighth-wave plate and the second eighth-wave plate.

14. A display with an active area and an inactive border, comprising:
- a display layer having an array of display pixels in the active area and having reflecting metal structures in the inactive border;
- a reflection suppressing layer that suppresses reflections from the array of display pixels and that overlaps the reflecting metal structures in the inactive border; and
- an opaque masking layer in the inactive area that is located between the reflection suppressing layer and the display layer.

15. The display defined in claim 14 wherein the array of display pixels comprises an array of organic light-emitting diode display pixels, wherein the display layer comprises an organic light-emitting diode layer, and wherein the display further comprises an encapsulating layer between the reflection suppressing layer and the organic light-emitting diode layer.

16. The display defined in claim 15 wherein reflection suppressing layer comprises a circular polarizer.

17. The display defined in claim 15 wherein the reflection suppressing layer comprises a color filter layer having an array of color filter elements of different colors.

18. A display with an active area and an inactive border, comprising:
- an organic light-emitting diode layer having an array of organic light-emitting diode display pixels in the active area and having support circuitry in the inactive area;
- a polarizer;
- a substrate between the polarizer and the organic light-emitting diode layer;
- an opaque masking layer on the substrate in the inactive area that overlaps the support circuitry; and
- a planarization layer on the substrate that overlaps the opaque masking layer, wherein the organic light-emitting diode layer is formed on the planarization layer.

19. The display defined in claim 18 further comprising an encapsulation layer, wherein the organic light-emitting diode layer is located between the planarization layer and the encapsulation layer.

20. The display defined in claim 19 wherein the substrate comprises a glass layer and wherein the polarizer comprises a circular polarizer.

* * * * *